(12) United States Patent
Yajima

(10) Patent No.: US 10,692,915 B2
(45) Date of Patent: Jun. 23, 2020

(54) IMAGING DEVICE AND METHOD OF MANUFACTURING IMAGING DEVICE

(71) Applicant: CANON KABUSHIKI KAISHA, Tokyo (JP)

(72) Inventor: Takahiro Yajima, Odawara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/391,798

(22) Filed: Apr. 23, 2019

(65) Prior Publication Data

US 2019/0355769 A1 Nov. 21, 2019

(30) Foreign Application Priority Data

May 18, 2018 (JP) .................................. 2018-096197

(51) Int. Cl.
*H01L 27/146* (2006.01)
*H04N 5/33* (2006.01)
(Continued)

(52) U.S. Cl.
CPC ............ *H01L 27/1463* (2013.01); *G06T 7/55* (2017.01); *H01L 27/1469* (2013.01);
(Continued)

(58) Field of Classification Search
CPC ......... H01L 31/0463; H01L 31/022408; H01L 31/02008; H01L 31/02013
See application file for complete search history.

(56) References Cited

U.S. PATENT DOCUMENTS 4,972,244 A * 11/1990 Buffet ................. H01L 27/1446
257/442
6,809,008 B1 * 10/2004 Holm ................ H01L 27/14634
438/455
(Continued)

FOREIGN PATENT DOCUMENTS

JP 2001-144278 5/2001
JP 2001352094 A * 12/2001
(Continued)

OTHER PUBLICATIONS

C.L. Chen, et al., "Wafer-Scale 3D Integration of InGaAs Image Sensors with Si Readout Circuits", IEEE International Conference on 3D System Integration, 2009. 3DIC 2009, pp. 1-4.

*Primary Examiner* — George R Fourson, III
(74) *Attorney, Agent, or Firm* — Venable LLP

(57) ABSTRACT

An imaging device includes a first substrate including a photoelectric conversion layer that includes a first semiconductor layer of a first conductivity type and a second semiconductor layer of a second conductivity type and in which a plurality of photoelectric conversion units are provided; a second substrate that is joined to the first substrate and in which a readout circuit substrate that outputs a signal based on information detected by the plurality of photoelectric conversion units is provided; and an element isolation portion defined by a first opening provided so as to penetrate the second substrate and at least one of the first semiconductor layer and the second semiconductor layer, and each of the plurality of photoelectric conversion units is separated from each other by the element isolation portion.

19 Claims, 11 Drawing Sheets

(51) Int. Cl.
*G06T 7/55* (2017.01)
*H04N 9/04* (2006.01)
*H01L 31/02* (2006.01)
*H01L 31/0463* (2014.01)
*H01L 31/0224* (2006.01)

(52) U.S. Cl.
CPC .. *H01L 27/14623* (2013.01); *H01L 27/14634* (2013.01); *H01L 27/14636* (2013.01); *H01L 27/14645* (2013.01); *H01L 27/14649* (2013.01); *H04N 5/33* (2013.01); *G06T 2207/10048* (2013.01); *G06T 2207/30252* (2013.01); *H01L 31/02008* (2013.01); *H01L 31/02013* (2013.01); *H01L 31/022408* (2013.01); *H01L 31/0463* (2014.12); *H04N 9/045* (2013.01)

(56) References Cited

U.S. PATENT DOCUMENTS

| | | | | |
|---|---|---|---|---|
| 2008/0211051 | A1* | 9/2008 | Prantl | H01L 27/14643 257/443 |
| 2009/0275165 | A1* | 11/2009 | Pourquier | H01L 27/1469 438/63 |
| 2012/0018618 | A1* | 1/2012 | Roy | H01L 27/14603 250/208.1 |
| 2012/0286144 | A1* | 11/2012 | Holz | G01J 1/42 250/214.1 |
| 2014/0197373 | A1* | 7/2014 | Iguchi | H01L 27/1446 257/13 |
| 2014/0353792 | A1* | 12/2014 | Ju | H01L 31/00 257/446 |
| 2015/0091121 | A1 | 4/2015 | Manda | |
| 2016/0197214 | A1* | 7/2016 | Balasekaran | H01L 27/1464 |
| 2016/0218128 | A1* | 7/2016 | Shieh | H01L 27/14609 |
| 2018/0309016 | A1* | 10/2018 | Badano | H01L 27/1443 |
| 2018/0374881 | A1* | 12/2018 | Rothman | H01L 31/1032 |
| 2019/0288026 | A1* | 9/2019 | Von Kaenel | H01L 27/14659 |

FOREIGN PATENT DOCUMENTS

| | | |
|---|---|---|
| JP | 2018-88488 | 6/2018 |
| WO | 2018/101033 | 6/2018 |

* cited by examiner

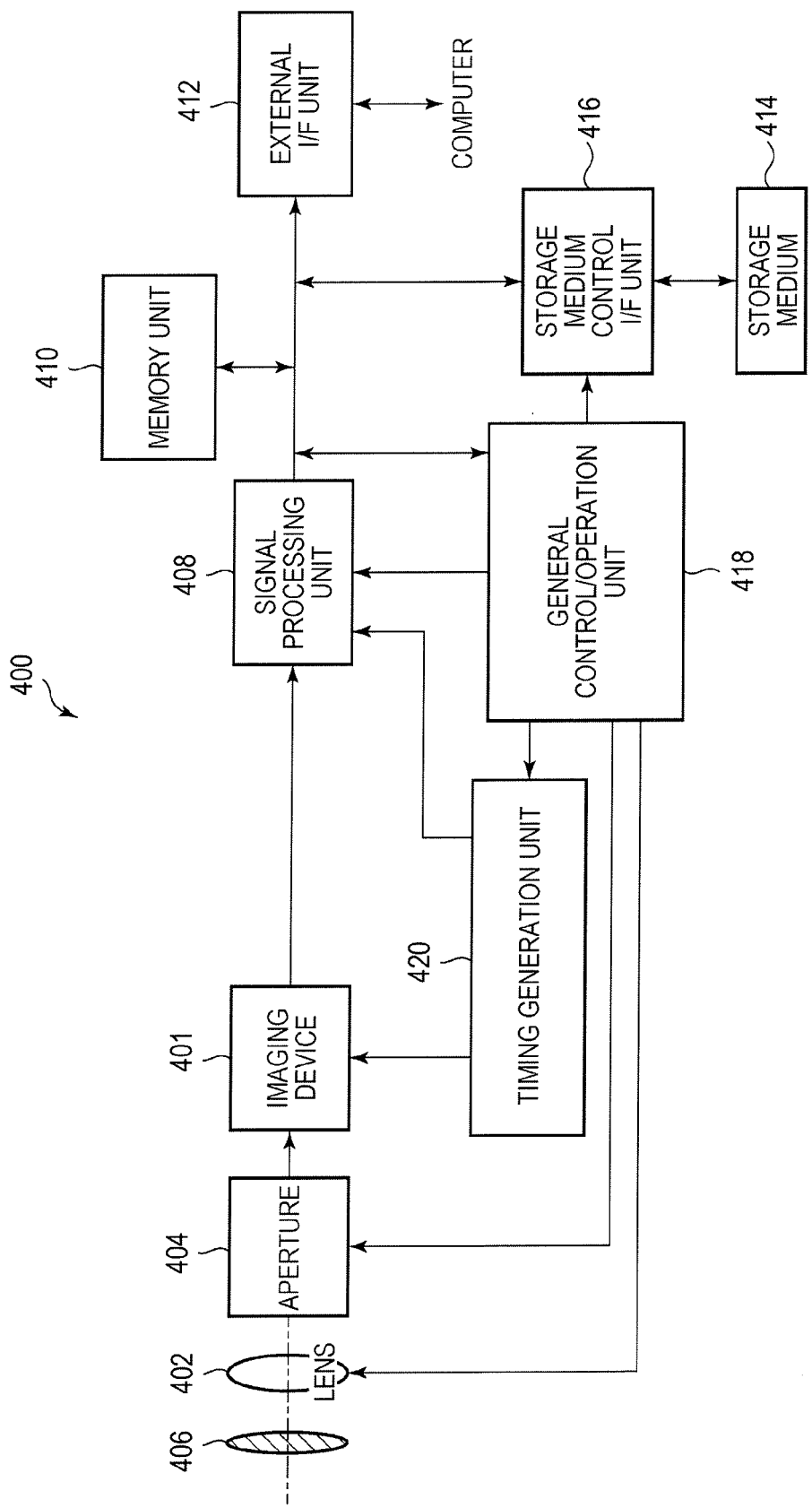

IMAGING DEVICE AND METHOD OF MANUFACTURING IMAGING DEVICE

BACKGROUND OF THE INVENTION

Field of the Invention

The present invention relates to an imaging device and a method of manufacturing imaging device.

Description of the Related Art

As an imaging device to be applied to monitoring cameras or the like for preventing crimes, there is an increasing interest in imaging devices that can acquire an image in the near infrared region. Also in an imaging device used for acquiring an image in the near infrared region, in the same manner as the imaging device used for acquiring an image in the visible light region, there is a demand for higher resolution by increasing the number of pixels, and the techniques to increase the size of a sensor or reduce the size of a pixel have been studied.

To absorb a light in the near infrared region and extract the light as an electric signal, a photoelectric conversion element forming a light receiving unit is preferably formed of a photoelectric conversion material having a high sensitivity to light in the near infrared region, for example, a compound semiconductor material such as an InP, an InGaAs, or the like. On the other hand, a readout circuit used for reading and processing a signal from the photoelectric conversion element is preferably formed by using silicon for which the integration technologies have been accumulated. Therefore, a typical imaging device having a sensitivity in the near infrared region has been manufactured by electrically and mechanically joining a compound semiconductor substrate on which a photoelectric conversion element is provided and a silicon substrate on which a readout circuit is provided to each other.

Chen et al. ("Wafer-Scale 3D Integration of InGaAs Image Sensors with Si Readout Circuits", 2009 IEEE International Conference on 3D System Integration, pp. 1-4) discloses a method of electrically connecting a photoelectric conversion element provided on a compound semiconductor substrate and a readout circuit provided on a silicon substrate by forming a through electrode that penetrates the silicon substrate after joining the compound semiconductor substrate and the silicon substrate to each other.

However, a method in which a compound semiconductor substrate and a silicon substrate are joined to each other and then an electrical connection between the substrates is provided by a through electrode may cause a disadvantage due to misalignment occurred when the substrates are joined to each other. For example, the through electrode is in contact with an element isolation portion that separates photoelectric conversion elements from each other, and thereby the contact resistance at the electrical connecting portion between the substrates may increase, or the isolation characteristic between the photoelectric conversion elements may decrease. As the size of a pixel is further reduced, the influence of misalignment becomes more significant.

SUMMARY OF THE INVENTION

The present invention intends to provide an imaging device and a method of manufacturing the imaging device that can suppress the influence of misalignment when substrates are joined to each other.

According to one aspect of the present invention, provided is an imaging device including a first substrate including a photoelectric conversion layer which includes a first semiconductor layer of a first conductivity type and a second semiconductor layer of a second conductivity type and in which a plurality of photoelectric conversion units are provided, a second substrate which is joined to the first substrate and in which a readout circuit that outputs a signal based on information detected by the plurality of photoelectric conversion units is provided, and an element isolation portion defined by a first opening provided so as to penetrate the second substrate and at least one of the first semiconductor layer and the second semiconductor layer, wherein each of the plurality of photoelectric conversion units is separated from each other by the element isolation portion.

Further, according to another aspect of the present invention, provided is a method of manufacturing an imaging device including forming a first semiconductor layer of a first conductivity type and a second semiconductor layer of a second conductivity type over a first substrate to form a photoelectric conversion layer including the first semiconductor layer and the second semiconductor layer, joining a second substrate to the first substrate on which the photoelectric conversion layer is provided, and forming a first opening from the second substrate side so as to penetrate at least the second substrate and the second semiconductor layer to separate the photoelectric conversion layer into a plurality of photoelectric conversion units.

Further features of the present invention will become apparent from the following description of exemplary embodiments with reference to the attached drawings.

BRIEF DESCRIPTION OF THE DRAWINGS

FIG. 12 is a block diagram illustrating the general configuration of an imaging system according to a fourth embodiment of the present invention.

DESCRIPTION OF THE EMBODIMENTS

Preferred embodiments of the present invention will now be described in detail in accordance with the accompanying drawings.

First Embodiment

An imaging device and a method of manufacturing the same according to a first embodiment of the present invention will be described with reference to FIG. 1 to FIG. 7.

Figure 1:
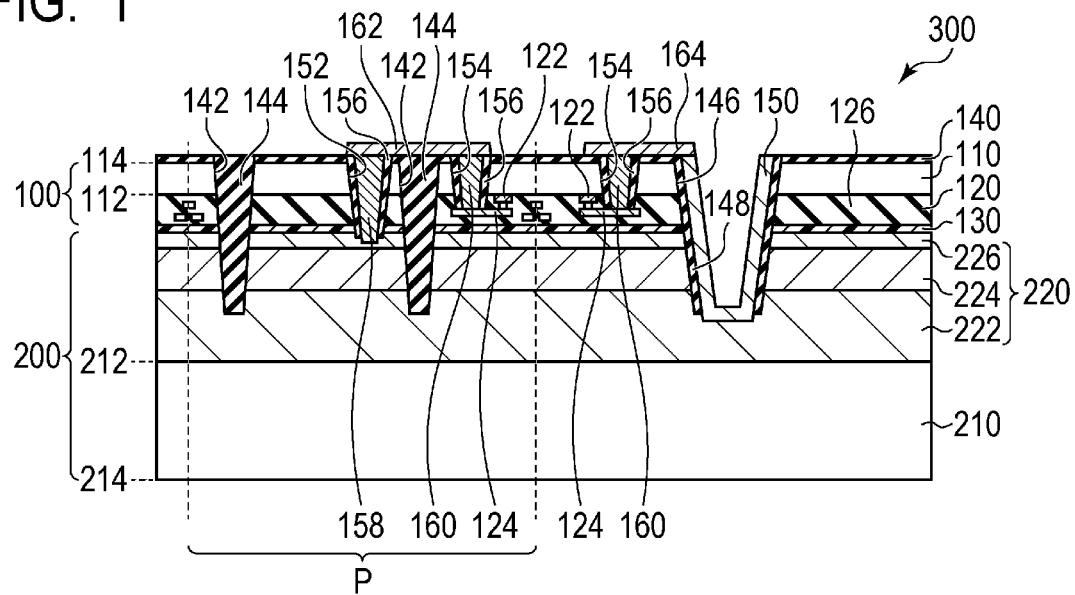
FIG. 1 is a schematic cross-sectional view illustrating the structure of an imaging device according to a first embodiment of the present invention.
Figure 2:
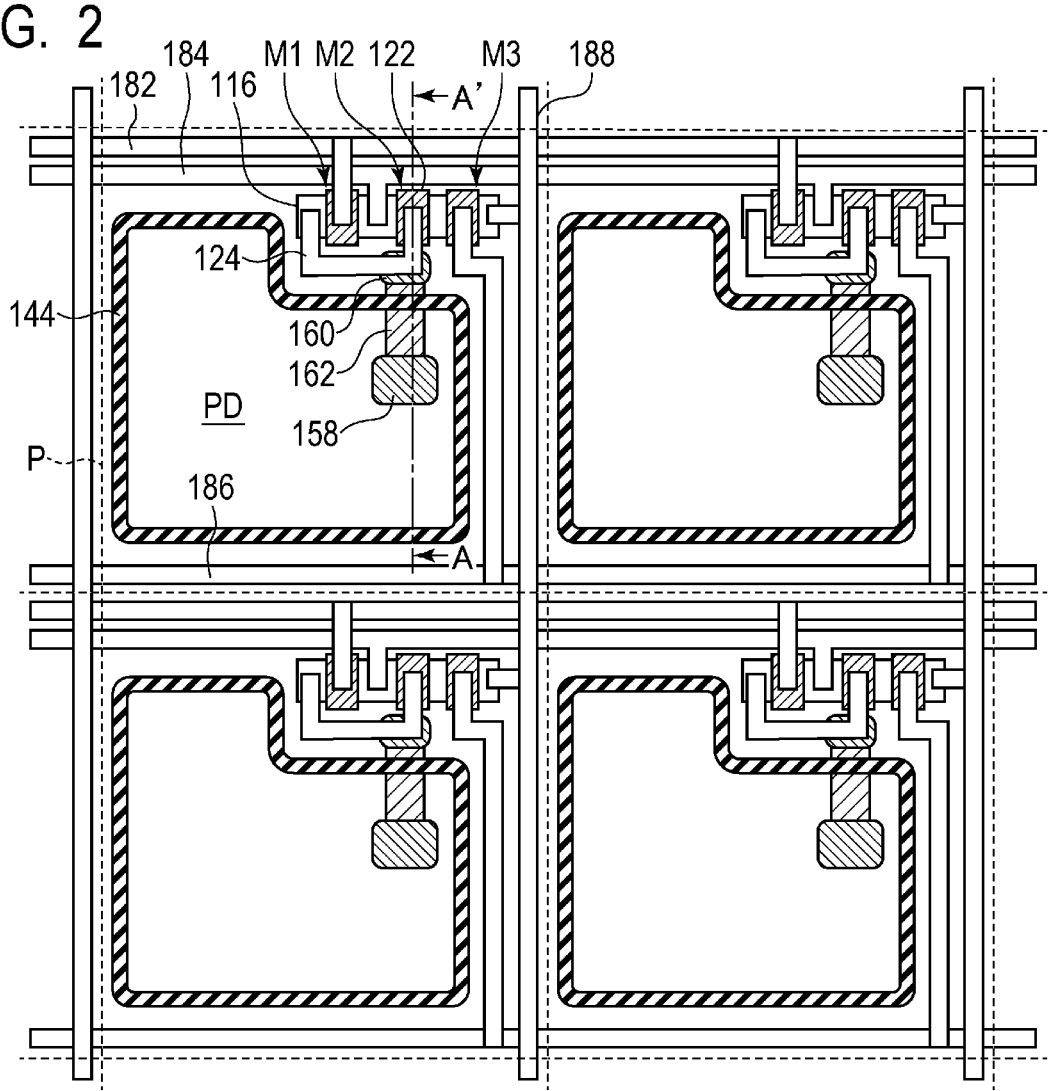
FIG. 2 is a plan view illustrating the structure of the imaging device according to the first embodiment of the present invention.

First, the structure of the imaging device according to the present embodiment will be described by using FIG. 1 and FIG. 2. FIG. 1 is a schematic cross-sectional view illustrating the structure of the imaging device according to the present embodiment. FIG. 2 is a plan view illustrating the structure of the imaging device according to the present embodiment.

An imaging device 300 according to the present embodiment has the structure in which a readout circuit substrate 100 and a sensor substrate 200 are joined to each other as illustrated in FIG. 1. The sensor substrate 200 is a substrate including a photo-sensor to capture an image. The readout circuit substrate 100 is a substrate including a Readout Integrated Circuit (RoIC) to output a signal (readout image signal) based on information detected by the photo-sensor on the sensor substrate 200.

The readout circuit substrate 100 includes a silicon substrate 110 having a first face 112 and a second face 114, a CMOS circuit portion 120 provided on the first face 112 side of the silicon substrate 110, and a surface protection layer 140 provided on the second face 114 side of the silicon substrate 110. The first face 112 and the second face 114 are a pair of opposing surfaces of the silicon substrate 110, and the second face 114 is a face opposite to the first face 112. FIG. 1 illustrates a gate electrode 122 of a MOS transistor forming a pixel circuit or a peripheral circuit as a part of components of the CMOS circuit portion 120, an interconnection 124 electrically connected to the gate electrode 122, and an interlayer insulating layer 126.

The sensor substrate 200 includes an InP substrate 210 having a first face 212 and a second face 214 and a photoelectric conversion layer 220 provided on the first face 212 side of the InP substrate 210.

The first face 212 and the second face 214 are a pair of opposing surfaces of the InP substrate 210, and the second face 214 is a face opposite to the first face 212. The photoelectric conversion layer 220 forms a p-n junction-type photodiode or a p-i-n junction-type photodiode including at least a semiconductor layer of a first conductivity type (for example, n-type) and a semiconductor layer of a second conductivity type (for example, p-type). For example, the photoelectric conversion layer 220 includes a p-type InP layer 222 provided over the first face 212 of the InP substrate 210, an undoped InGaAs layer 224 provided over the p-type InP layer 222, and an n-type InP layer 226 provided over the undoped InGaAs layer 224. The p-type InP layer 222, the undope InGaAs layer 224, and the n-type InP layer 226 form a p-i-n junction-type photodiode in which the undoped InGaAs layer 224 is used as a light receiving layer having an absorption wavelength band in the infrared wavelength band.

In terms of providing a readout integrated circuit on the readout circuit substrate 100, a silicon substrate having well-accumulated technologies in the wafer process and the integration process is preferably used as a base material. Further, the main reason to mount a photo-sensor on a sensor substrate 200, which is different from the readout circuit substrate 100, is to use a substrate made of a material different in light absorption characteristics from the material of the readout circuit substrate 100. Accordingly, as a base material of the sensor substrate 200, a substrate made of a material different from silicon, for example, a compound semiconductor substrate is preferably used. The compound semiconductor substrate may be an InP substrate, a GaAs substrate, or the like. Note that the absorption wavelength band of an InGaAs based material, a GaAsSb based material, an AlGaInAsP based material, or the like which can be crystal-grown on an InP substrate or a GaAs substrate is on the longer wavelength band side of the absorption wavelength band of a single crystal silicon. The sensor substrate 200 may be a substrate in which a compound semiconductor layer such as an InP layer is provided on another substrate such as a sapphire substrate. In the present embodiment, while an example in which the silicon substrate 110 is used as the base material of the readout circuit substrate 100 and the InP substrate 210 is used as the base material of the sensor substrate 200 will be described, materials used for the readout circuit substrate 100 and the sensor substrate 200 can be appropriately selected as required.

The readout circuit substrate 100 and the sensor substrate 200 are joined such that the first face 112 side of the silicon substrate 110 and the first face 212 side of the InP substrate 210 face each other. While the readout circuit substrate 100 and the sensor substrate 200 are joined via an adhesive layer 130 in FIG. 1, a method of joining the readout circuit substrate 100 and the sensor substrate 200 to each other is not particularly limited.

In the readout circuit substrate 100 and the sensor substrate 200, an element isolation groove (first opening) 142 that penetrates the silicon substrate 110, the interlayer insulating layer 126, the adhesive layer 130, the n-type InP layer 226, and the undoped InGaAs layer 224 and reaches the p-type InP layer 222 is provided. Thereby, an element isolation portion 144 in which the element isolation groove 142 is filled with an insulating member is provided. In other words, the element isolation groove 142 defines the element isolation portion 144.

The element isolation portion 144 has a function of separating the photoelectric conversion layer 220 into a plurality of photoelectric conversion units corresponding to respective pixels. In particular, as described in the present embodiment, when the semiconductor layer forming the photoelectric conversion layer 220 is formed of a semiconductor material having a carrier mobility that is not less than the carrier mobility of silicon, diffusion of optical carriers generated in the photoelectric conversion layer 220 to the surroundings causes an image blur. The element isolation portion 144 is responsible for preventing optical carriers generated in the photoelectric conversion layer 220 from diffusing to peripheral pixels.

Further, an opening 146 that penetrates the silicon substrate 110, the interlayer insulating layer 126, the adhesive layer 130, the n-type InP layer 226, and the undoped InGaAs layer 224 and reaches the p-type InP layer 222 is provided in the readout circuit substrate 100 and the sensor substrate 200. A common electrode 150 electrically connected to the p-type InP layer 222 at the bottom of the opening 146 is provided inside the opening 146. The common electrode 150 is a through electrode provided by penetrating the readout circuit substrate 100. The common electrode 150 is insulated from the silicon substrate 110, the n-type InP layer 226, and the undoped InGaAs layer 224 by an insulating film 148 provided on the sidewall portion of the opening 146. The common electrode 150 is the anode electrode common to a plurality of photodiodes provided on the sensor substrate 200.

Further, an opening 152 that penetrates the silicon substrate 110, the interlayer insulating layer 126, and the adhesive layer 130 and reaches the n-type InP layer 226 is provided in the readout circuit substrate 100. A through electrode 158 electrically connected to the n-type InP layer 226 at the bottom of the opening 152 is provided inside the opening 152. The through electrode 158 is insulated from the silicon substrate 110 by an insulating film 156 provided on the sidewall portion of the opening 152.

Further, an opening 154 that penetrates the silicon substrate 110 and a part of the interlayer insulating layer 126 and reaches the interconnection 124 is provided in the readout circuit substrate 100. A contact plug 160 electrically connected to the interconnection 124 at the bottom of the opening 154 is provided inside the opening 154. The contact plug 160 is insulated from the silicon substrate 110 by the insulating film 156 provided on the sidewall portion of the opening 154.

The through electrode 158 and the contact plug 160 are electrically connected to each other by an interconnection 162 provided over the second face 114 side of the silicon substrate 110. Further, the common electrode 150 and the contact plug 160 are electrically connected to each other by an interconnection 164 arranged over the second face 114 side of the silicon substrate 110.

FIG. 2 is a plan view illustrating the arrangement of four pixels P arranged in a matrix of two rows and two columns. FIG. 2 illustrates the planar positional relationship of each component when viewed from the second face 214 side of the InP substrate 210 that is a light incident face. A cross-sectional view taken along the line A-A' of FIG. 2 corresponds to the cross-sectional view of the pixel portion in FIG. 1.

Each of the pixels P includes a photodiode PD, a reset transistor M1, an amplifier transistor M2, and a select transistor M3 as illustrated in FIG. 1, for example. The photodiode PD is arranged on the InP substrate 210 of the sensor substrate 200 as described above. The reset transistor M1, the amplifier transistor M2, and the select transistor M3 are arranged in an active region 116 provided on the silicon substrate 110 of the readout circuit substrate 100.

The source of the reset transistor M1 is electrically connected to the gate of the amplifier transistor M2 via the interconnection 124. The drain of the reset transistor M1 and the drain of the amplifier transistor M2 are electrically connected to a power supply line 184 arranged in the row direction. The source of the amplifier transistor M2 is connected to the drain of the select transistor M3. The source of the select transistor M3 is electrically connected to an output line 188 arranged in the column direction. The gate of the reset transistor M1 is electrically connected to a reset line 182 arranged in the row direction. The gate of the select transistor M3 is electrically connected to a select line 186 arranged in the row direction.

As illustrated in FIG. 2, a light receiving region of the photodiode PD in each of the pixels P is defined by the element isolation portion 144 provided in an annular shape in a plan view. As illustrated in FIG. 1 and FIG. 2, the n-type InP layer 226, which is the cathode of the photodiode PD, is electrically connected to the interconnection 124 via the through electrode 158, the interconnection 162, and the contact plug 160 so as to cross over the element isolation portion 144. The p-type InP layer 222, which is the anode of the photodiode PD, is electrically connected to the interconnection 164 via the common electrode 150.

That is, the sensor substrate 200 forms photodiode arrays in which the photodiodes PD of the plurality of pixels P are arranged in a matrix. One electrode on the n-type InP layer 226 side of the pair of electrodes of each of the photodiodes PD is an individual electrode and electrically connected to the interconnection 124 via the through electrode 158, the interconnection 162, and the contact plug 160. The electrode on the p-type InP layer 222 side of the pair of electrodes of each of the photodiodes PD is connected to the common electrode 150 shared by a plurality of pixels P.

Once a light enters the imaging device, the photodiode PD of each pixel P converts (photoelectrically converts) the incident light to charges in accordance with the amount of the light. The amplifier transistor M2 forms an amplifier unit having a gate to which the cathode of the photodiode PD is connected as an input node. Thereby, the amplifier transistor M2 outputs a signal in accordance with the charges generated in the photodiode PD. The select transistor M3 transitions to an on-state in response to a control signal supplied from the select line 186 and outputs a signal output from the amplifier transistor M2 to the output line 188. The reset transistor M1 transitions to an on-state in response to a control signal supplied from the reset line 182 and resets the potential of the input node of the amplifier unit.

Next, a method of manufacturing the imaging device according to the present embodiment will be described by using FIG. 3A to FIG. 4J. FIG. 3A to FIG. 4J are cross-sectional views illustrating a method of manufacturing the imaging device according to the present embodiment. FIG. 3A to FIG. 3F are cross-sectional views illustrating the whole structure of a wafer on which a plurality of imaging devices are formed, and FIG. 4A to FIG. 4J are partial cross-sectional views illustrating a main part of one imaging device.

Figure 3A:
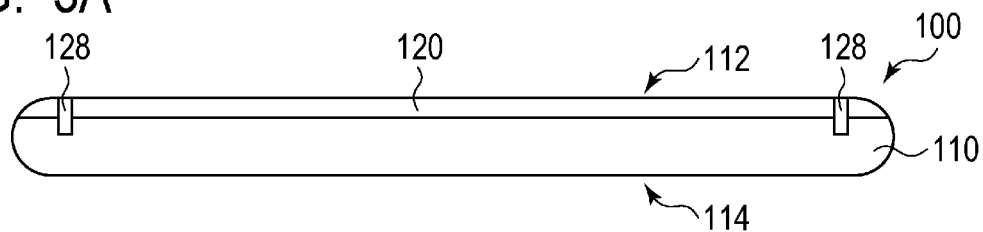
FIG. 3A, FIG. 3B, FIG. 3C, FIG. 3D, FIG. 3E, and FIG. 3F are cross-sectional views illustrating a method of manufacturing the imaging device according to the first embodiment of the present invention (Part 1).
Figure 4A:
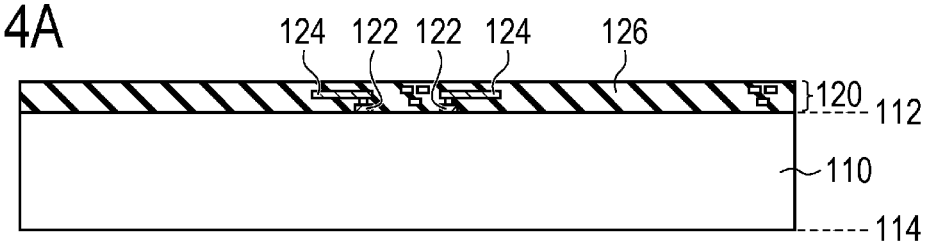
FIG. 4A, FIG. 4B, FIG. 4C, FIG. 4D, FIG. 4E, FIG. 4F, FIG. 4G, FIG. 4H, FIG. 4I and FIG. 4J are process cross-sectional views illustrating the method of manufacturing the imaging device according to the first embodiment of the present invention (Part 2).

First, for example, a 4-inch silicon substrate 110 is prepared as a base material of the readout circuit substrate 100. The silicon substrate 110 has the first face 112 and the second face 114, which form a pair of surfaces. Next, a CMOS circuit portion 120 is formed on the first face 112 side of the silicon substrate 110 by using a typical CMOS process. The CMOS circuit portion 120 includes a MOS transistor forming a pixel circuit or a peripheral circuit, an interconnection electrically connecting the MOS transistors to each other, an interlayer insulating layer, or the like (FIG. 3A and FIG. 4A). FIG. 4A illustrates the gate electrode 122 of the MOS transistor, the interconnection 124 electrically connected to the gate electrode 122, and the interlayer insulating layer 126 as a part of elements forming the CMOS circuit portion 120. An alignment mark 128 is desirably provided on the silicon substrate 110 as illustrated in FIG. 3A, for example. In such a way, the readout circuit substrate 100 on which the CMOS circuit portion 120 is provided on the silicon substrate 110 is formed.

Figure 3B:
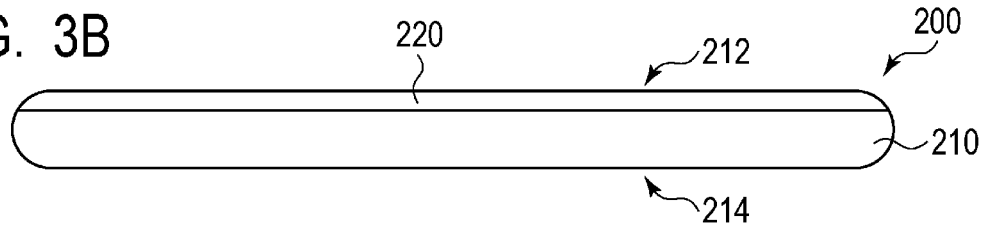
Figure 4B:
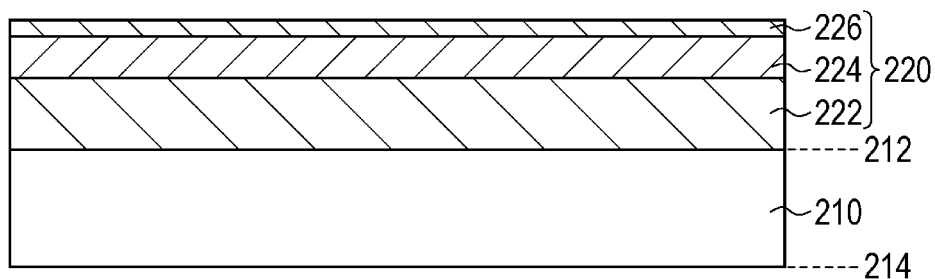

Further, for example, a 4-inch InP substrate 210 is prepared as a base material of the sensor substrate 200. The InP substrate 210 has the first face 212 and the second face 214, which form a pair of surfaces. Next, the p-type InP layer 222, the undoped InGaAs layer 224, and the n-type InP layer 226 are epitaxially grown on the first face 212 side of the InP substrate 210 in the described order to form a photoelectric conversion layer 220 (FIG. 3B and FIG. 4B). The compositions of In and Ga of the undoped InGaAs layer 224 are set to compositions lattice-matched to the InP substrate 210. In such a way, the sensor substrate 200 on which the photoelectric conversion layer 220 is provided on the InP substrate 210 is formed.

Figure 3C:
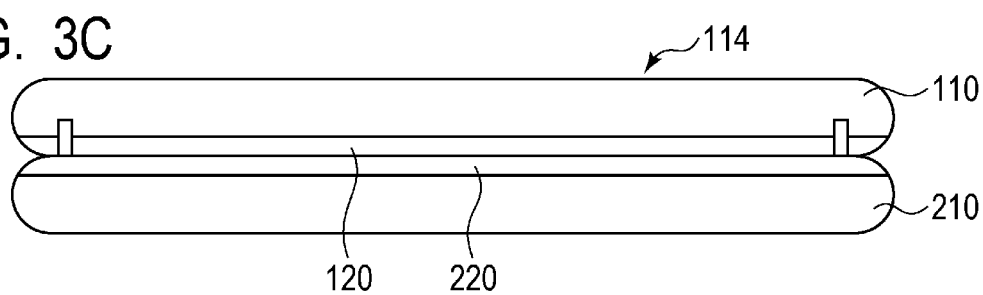

Next, the readout circuit substrate 100 and the sensor substrate 200 are joined such that the face on the first face 112 side of the silicon substrate 110 and the face on the first face 212 side of the InP substrate 210 face each other (FIG. 3C). At this time, since no particular pattern such as an element isolation portion is provided in the sensor substrate 200, high stacking alignment accuracy is not required between the readout circuit substrate 100 and the sensor substrate 200. That is, the process of joining the readout circuit substrate 100 and the sensor substrate 200 does not affect reduction in size of the elements.

A method of joining the readout circuit substrate 100 and the sensor substrate 200 to each other is not particularly limited and an adhesive joining by using an adhesive agent, a plasma activated joining via an oxide film surface, a diffusion joining via a thin metal layer, or the like can be preferably used, for example. In this case, as illustrated in FIG. 4C, the readout circuit substrate 100 and the sensor substrate 200 are joined to each other via the adhesive layer 130.

Figure 3D:
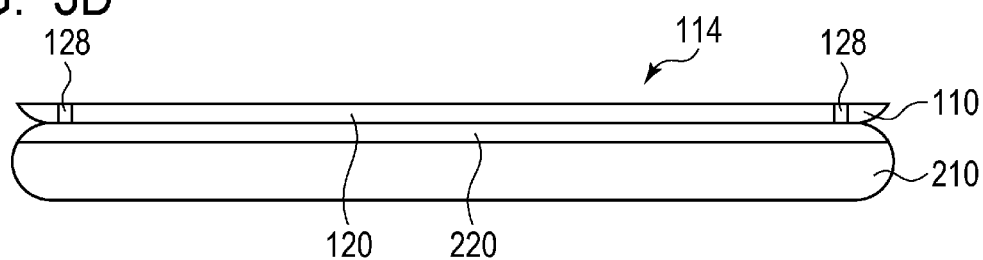
Figure 4C:
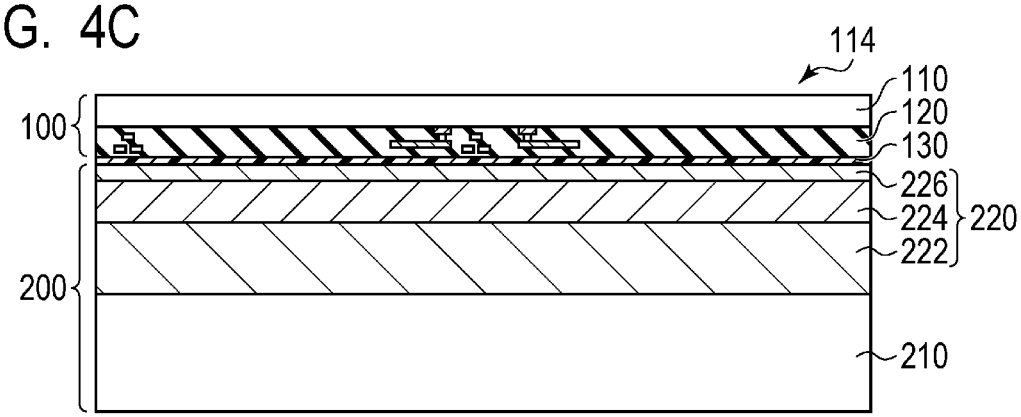

Next, with the readout circuit substrate 100 and the sensor substrate 200 being joined to each other, the silicon substrate 110 is polished from the second face 114 side by using a back-grinding apparatus, and the silicon substrate 110 is thinned down to approximately 10 μm in thickness (FIG. 3D and FIG. 4C). The second face 114 of the silicon substrate 110 is then polished by a CMP method, and the cutting scratches caused by the back-grinding apparatus are removed. After polishing the silicon substrate 110, the alignment mark 128 is exposed on the second face 114 side.

Note that, by using a substrate having different etching characteristics in the depth direction as the silicon substrate 110, it is also possible to improve the in-plane evenness of the wafer thickness. For example, an etchant formed of a mixed solution of hydrofluoric acid, nitric acid, and acetic acid has an etching rate greatly different between the p-type silicon and the n-type silicon. Therefore, by exploiting the difference in the etching selection ratio between the p-type silicon and the n-type silicon, it is possible to realize the thickness of a wafer having high in-plane evenness. Alternatively, an SOI substrate can be used instead of the silicon substrate 110. For example, when a wafer using the SOI substrate is thinned by the dry etching process, the etching selection ratio of silicon oxide to silicon is approximately 10, which is large. Therefore, by utilizing an SOI layer as an etching stop layer, it is possible to realize the thickness of a wafer having high in-plane evenness.

Next, an insulating film such as a silicon oxide film or a silicon nitride film is deposited over the second face 114 of the thinned silicon substrate 110 by a CVD method, for example, and a surface protection layer 140 formed of the insulating film is formed.

Figure 4D:
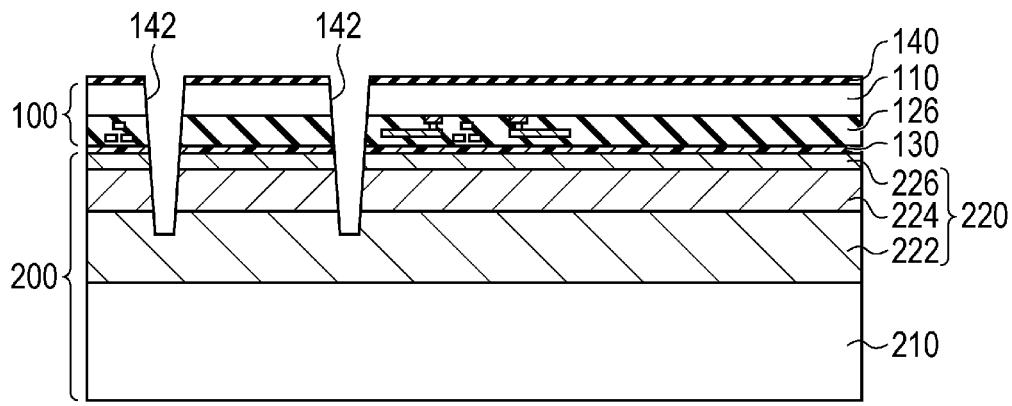

Next, after forming a photoresist film (not illustrated) having an opening in the formation region of the element isolation portion 144 on the surface protection layer 140, the readout circuit substrate 100 and the sensor substrate 200 are dry-etched by using the photoresist film as a mask. Thereby, the element isolation groove 142 that penetrates the surface protection layer 140, the silicon substrate 110, the interlayer insulating layer 126, the adhesive layer 130, the n-type InP layer 226, and the undoped InGaAs layer 224 and reaches the p-type InP layer 222 is formed (FIG. 4D).

Note that, in photolithography in this process and subsequent processes, alignment can be performed using the alignment mark 128 exposed on the second face 114 side of the silicon substrate 110. Thereby, high alignment accuracy can be ensured for the interconnection 124 or the like provided in the CMOS circuit portion 120.

Figure 4E:
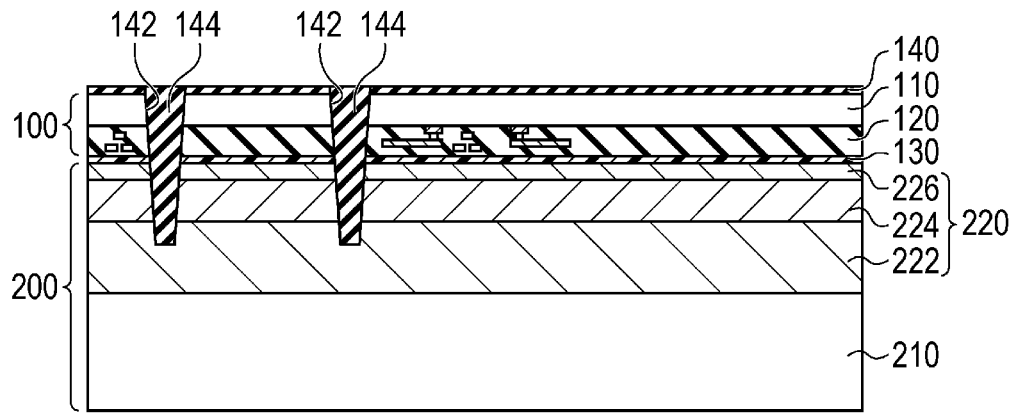

Next, after an insulating film such as a silicon oxide film or a silicon nitride film is deposited by a plasma CVD method to fill the element isolation groove 142, the insulating film over the surface protection layer 140 is removed by a CMP method, for example. In such a way, the element isolation portion 144 formed by filling the insulating film in the element isolation groove 142 is formed (FIG. 4E). Thereby, the n-type InP layer 226 and the undoped InGaAs layer 224 forming the photodiode PD of each pixel P are isolated for each pixel P by the element isolation portion 144.

Note that at least a portion of the element isolation portion 144 that is in contact with the wall surface of the element isolation groove 142 is desirably formed of an insulating member. With such a configuration, a leakage current generated on the etching wall surface of the photoelectric conversion layer 220 can be suppressed. In particular, when the element isolation portion 144 is formed of an insulating member containing hydrogen, an unbonded hand (dangling bond) on the surface roughened by the etching process can be terminated with hydrogen, and thereby the leakage current can be further reduced.

As described above, in the present embodiment, the photodiode PD of each pixel P can be isolated by the element isolation portion 144 formed after joining the readout circuit substrate 100 and the sensor substrate 200 to each other. It is therefore not necessary to increase stacking accuracy when joining the readout circuit substrate 100 and the sensor substrate 200 to each other.

Next, after forming a photoresist film (not illustrated) having an opening in the formation region of the common electrode 150 over the surface protection layer 140, the readout circuit substrate 100 and the sensor substrate 200 are dry-etched by using the photoresist film as a mask. Thereby, the opening 146 that penetrates the surface protection layer 140, the silicon substrate 110, the interlayer insulating layer 126, the adhesive layer 130, the n-type InP layer 226, and the undoped InGaAs layer 224 and reaches the p-type InP layer 222 is formed.

Figure 4F:
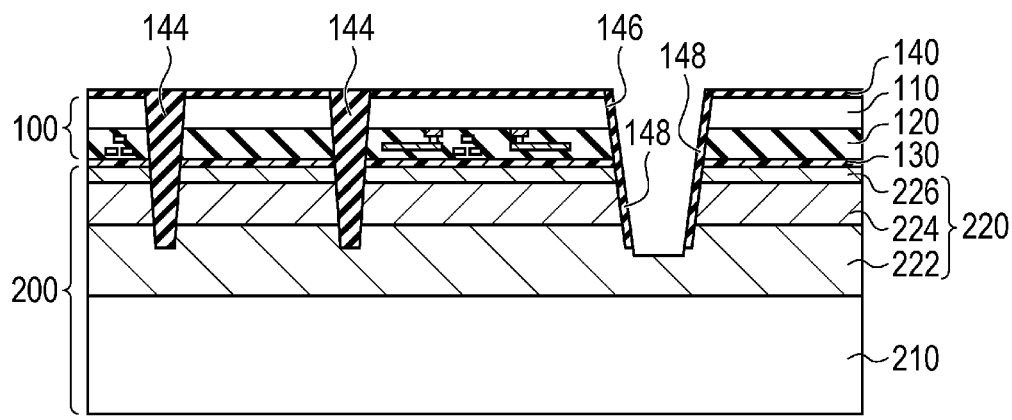

Next, after depositing the insulating film 148 such as a silicon oxide film or a silicon nitride film by a CVD method, the insulating film 148 is etched back, for example. Thereby, while the insulating film 148 is left on the sidewall portion of the opening 146, the insulating film 148 at the bottom of the opening 146 is removed (FIG. 4F).

Figure 4G:
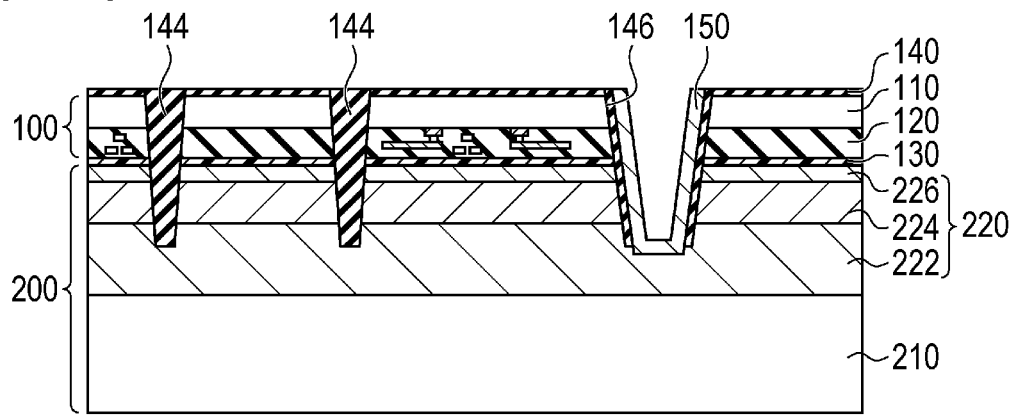

Next, after a metal film formed of aluminum, titanium, copper, or the like is formed by a sputtering method, a plating method, or the like, the metal film is patterned by photolithography and dry etching. Thereby, the common electrode 150 that is provided in the opening 146 and is electrically connected to the p-type InP layer 222 at the bottom of the opening 146 is formed (FIG. 4G).

Next, after forming a photoresist film (not illustrated) having an opening in the formation region of the through electrode 158 and the contact plug 160 over the surface protection layer 140, the readout circuit substrate 100 is dry-etched by using the photoresist film as a mask. Thereby, the opening 152 that penetrates the surface protection layer 140, the silicon substrate 110, the interlayer insulating layer 126, and the adhesive layer 130 and reaches the n-type InP layer 226 is formed. Further, the opening 154 that penetrates a part of the surface protection layer 140, the silicon substrate 110, and the interlayer insulating layer 126 and reaches the interconnection 124 is formed.

Figure 4H:
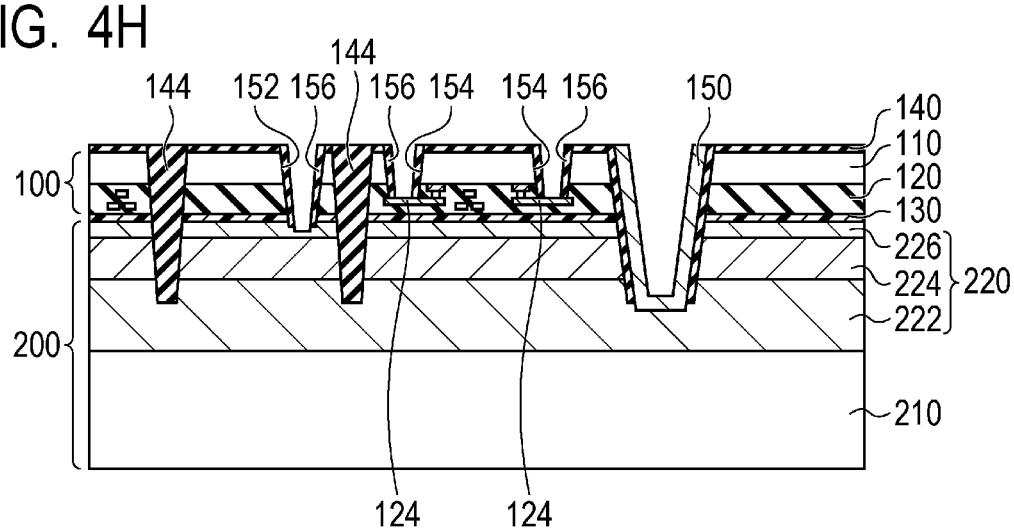

Next, after depositing the insulating film 156 such as a silicon oxide film or a silicon nitride film by a CVD method, for example, the insulating film 148 is etched back. Thereby, while the insulating films 156 are left on the sidewall portion of the opening 152 and the opening 154, the insulating films 156 at the bottoms of the opening 152 and the opening 154 are removed (FIG. 4H).

Figure 4I:
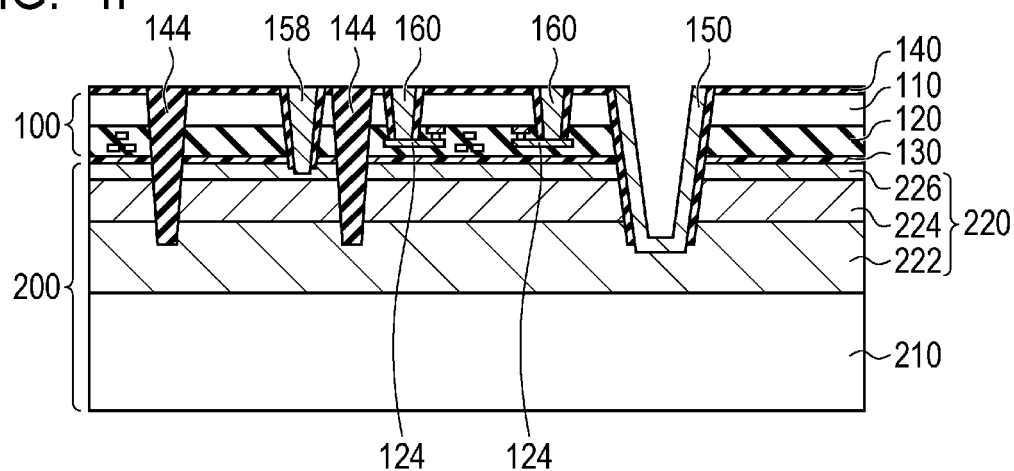

Next, after a metal film formed of aluminum, titanium, copper, or the like is formed by a sputtering method, a plating method, or the like, the metal film is polished by a CMP method and the metal film on the surface protection layer 140 is removed. Thereby, the through electrode 158 that is provided in the opening 152 and is electrically connected to the n-type InP layer 226 at the bottom of the opening 152 is formed. Further, the contact plug 160 that is provided in the opening 154 and electrically connected to the interconnection 124 at the bottom of the opening 154 is formed (FIG. 4I).

Figure 3E:
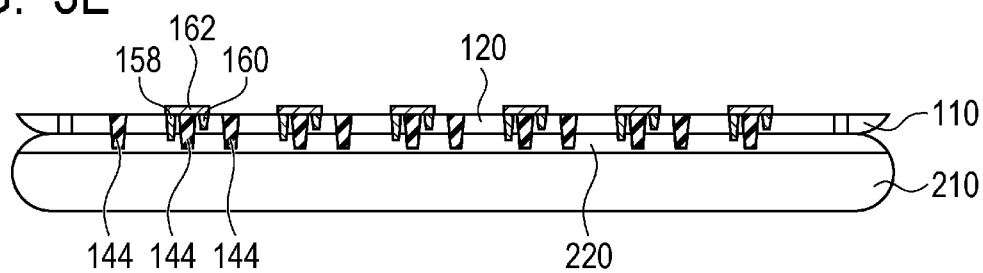
Figure 4J:
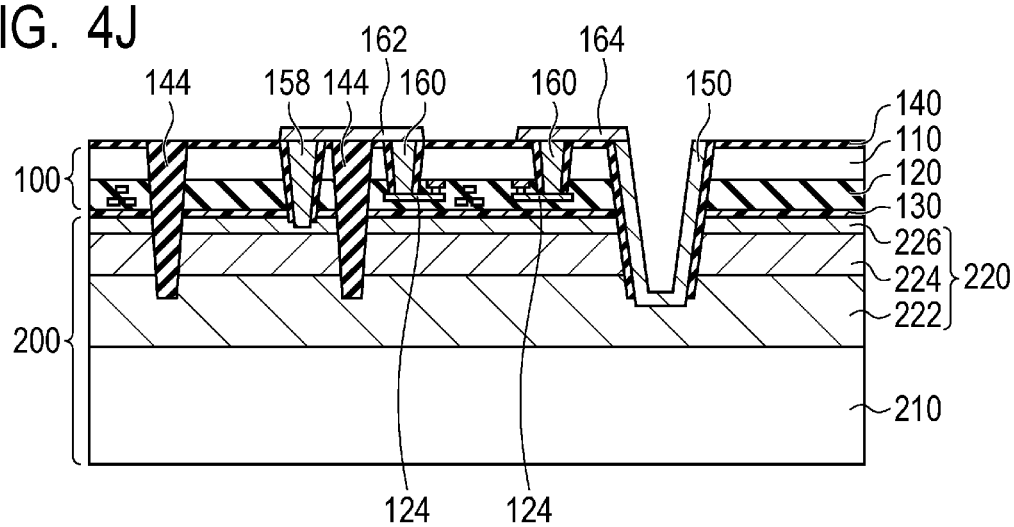

Next, after a metal film formed of aluminum, titanium, copper, or the like is formed by a sputtering method, a plating method, or the like, the metal film is patterned by photolithography and dry etching. Thereby, an interconnection layer in which the interconnection 162 that electrically connects the through electrode 158 and the contact plug 160, the interconnection 164 that electrically connects the common electrode 150 and the contact plug 160, and the like are included is formed (FIG. 3E and FIG. 4J).

Figure 3F:
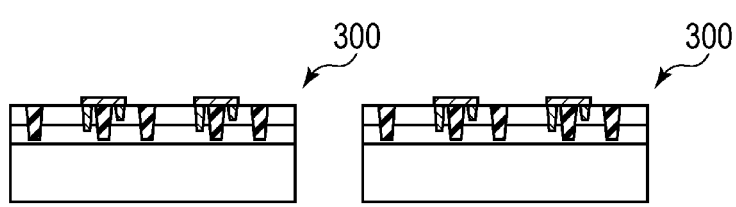

Next, after forming a protection layer used for preventing corrosion of the metal interconnection if necessary, the imaging device 300 according to the first embodiment illustrated in FIG. 1 is completed by dicing the substrate obtained by joining the readout circuit substrate 100 and the sensor substrate 200 to each other to a chip size (FIG. 3F).

Figure 5:
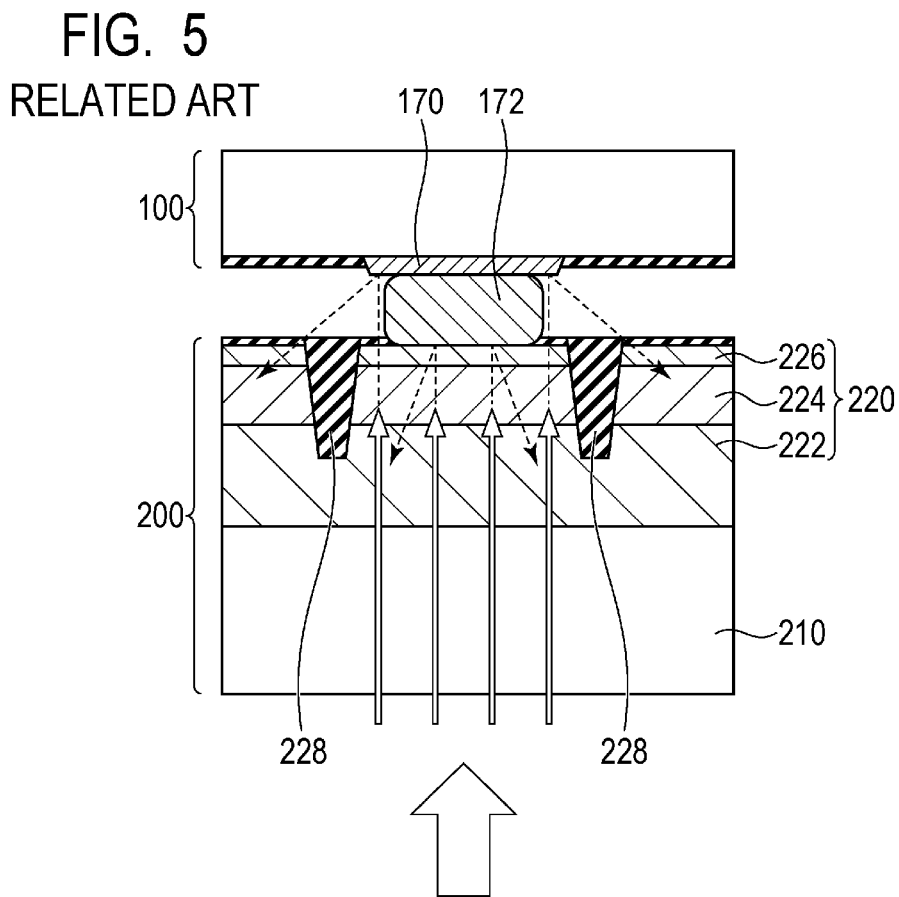
FIG. 5 is a diagram illustrating the structure and an object of an imaging device according to a first reference example.
Figure 6:
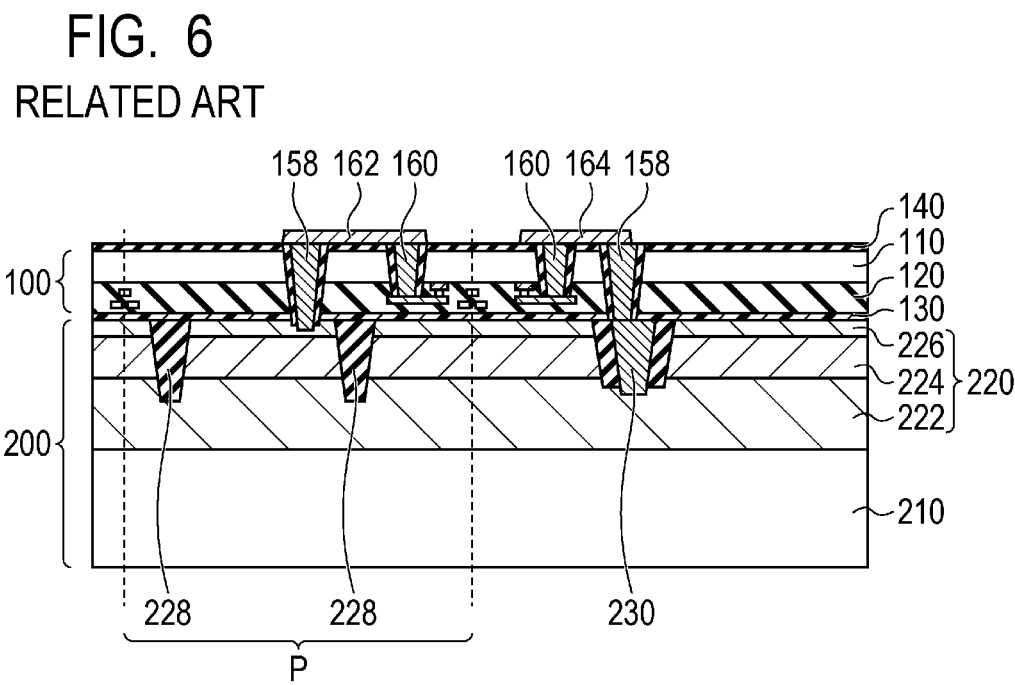
FIG. 6 is a diagram illustrating the structure and an object of an imaging device according to a second reference example.
Figure 7:
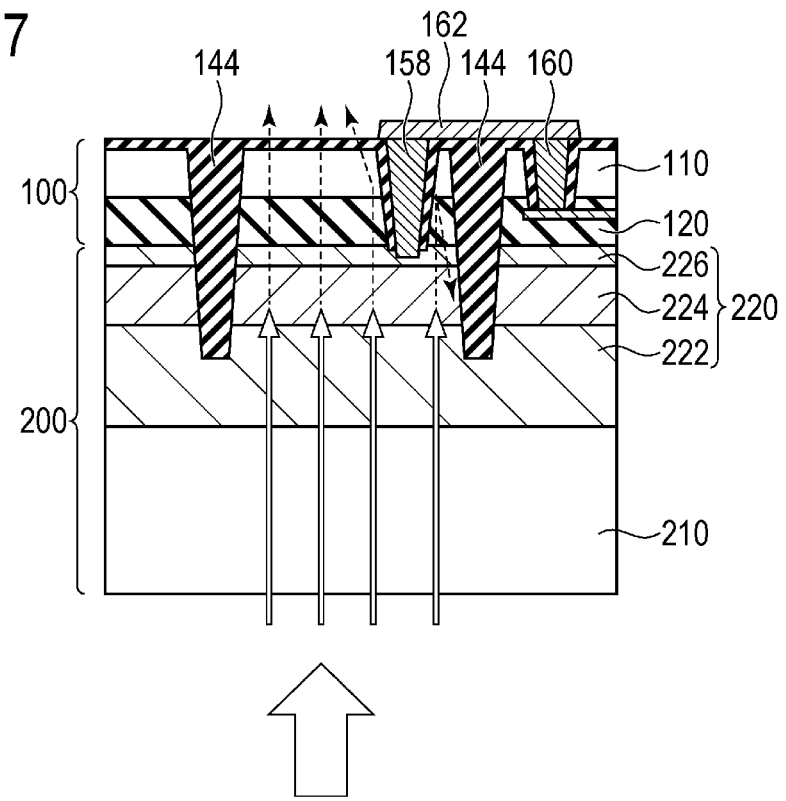
FIG. 7 is a diagram illustrating the effect and advantage of the imaging device according to the first embodiment of the present invention.

Next, a specific advantage provided by the imaging device and the manufacturing method thereof according to the present embodiment will be described by using FIG. 5 to FIG. 7. FIG. 5 is a diagram illustrating the structure and an object of the imaging device according to a first reference example. FIG. 6 is a diagram illustrating the structure and an object of the imaging device according to a second reference example. FIG. 7 is a diagram illustrating the effect and advantage of the imaging device according to the present embodiment.

As a method of electrically connecting the readout circuit substrate 100 and the sensor substrate 200, there is a method in which a solder ball or a solder plating bump is used. FIG. 5 is a schematic cross-sectional view illustrating the structure of a connecting portion in an imaging device according to the first reference example in which the readout circuit substrate 100 and the sensor substrate 200 are connected to each other via a bump electrode 172.

In the imaging device according to the first reference example, the readout circuit substrate 100 and the sensor substrate 200 are electrically connected to each other via the bump electrode 172 arranged on a pad electrode 170 of the readout circuit substrate 100 as illustrated in FIG. 5, for example. A light incident from the rear face side of the sensor substrate 200 (indicated by an arrow in FIG. 5) is absorbed in the light receiving layer of the photodiode PD of each pixel defined by the element isolation portion 228, and carriers are generated by photoelectric conversion. At this time, a part of the incident light is not absorbed by the photodiode PD and transmitted through the sensor substrate 200. When the transmitted light is reflected by a metal member such as the bump electrode 172, a pad electrode 170, or the like and reenters the adjacent pixel region, a blur occurs in the image, which causes degradation of the image quality.

In the imaging device according to the first reference example, a smaller pitch of the allayed photodiodes PD results in more significant deterioration of resolution due to the re-entry of the incident light described above. Therefore, attempt to maintain the sensor unit in a certain size makes it difficult to increase the number of pixels, and it is thus difficult to achieve high image quality. Further, to increase the number of pixels, it is necessary to increase the chip size, which is contrary to a demand for reduction in size, and an increase in cost is inevitable.

Further, since the linear expansion coefficient is significantly different between silicon, which is a base material of the readout circuit substrate 100, and a compound semiconductor such as InP, which is a base material of the sensor substrate 200, distortion due to warp and deformation of the chip occurs when a thermal processing is performed. Since larger distortion of the chip is more significant for a larger chip size, there is a limit in increase of the sensor in size. Further, while reduction in size of the bump electrode 172 is necessary for reduction in size of the pixels, the height of the bump electrode 172 needs to be reduced along with reduction in size. Since the influence of distortion due to warp and deformation of the chip becomes larger when the height of the bump electrode 172 is reduced, pixel defects due to a connection failure between the substrates increase.

As another method of electrically connecting the readout circuit substrate 100 and the sensor substrate 200, there is a method in which a through electrode is used. FIG. 6 is a schematic cross-sectional view illustrating the structure of a connecting portion in an imaging device according to the second reference example in which the readout circuit substrate 100 and the sensor substrate 200 are connected to each other via the through electrode 158.

In the imaging device according to the second reference example, the element isolation portion 228 or the common electrode 230 used for isolation of the photodiode PD of each pixel P is formed on the sensor substrate 200, and the readout circuit substrate 100 and the sensor substrate 200 are then joined to each other. Then, the through electrode 158, the contact plug, or the like that penetrates the readout circuit substrate 100 is formed to electrically connect the readout circuit substrate 100 and the sensor substrate 200. By polishing and thinning the readout circuit substrate 100 after joining the readout circuit substrate 100 and the sensor substrate 200 to each other, it is possible to reduce occurrence of distortion due to the difference in linear expansion coefficients between the readout circuit substrate 100 and the sensor substrate 200.

To connect the readout circuit substrate 100 and the sensor substrate 200 with precision in the imaging device according to the second reference example, however, the stacking alignment accuracy in joining the readout circuit substrate 100 and the sensor substrate 200 to each other is important. The stacking alignment accuracy at the time of wafer joining is affected by the magnification of the optical microscope or the stage movement accuracy of the joining device or warp or deformation of the wafer. Further, a large slip may be caused by an adhesive agent used for joining wafers. Furthermore, the stacking alignment accuracy is also affected by the thermal history during the wafer joining process, and when the difference in the linear expansion coefficients between the readout circuit substrate 100 and the sensor substrate 200 is large, large stacking misalignment that cannot be ignored may occur.

When a large stacking misalignment occurs between the readout circuit substrate 100 and the sensor substrate 200, the element isolation portion 228 and the through electrode 158 are in contact with each other, and this causes reduction in the isolation characteristics between the pixels P. Further, this also causes a contact failure in a connecting portion between the through electrode 158 and the photodiode PD or a connecting portion between the through electrode 158 and the common electrode 230.

Further, as with the case of the first reference example, a problem of re-entry of the light transmitted through the sensor substrate 200 to adjacent pixels may occur.

Regarding this point, in the imaging device according to the present embodiment, as illustrated in FIG. 7, the element isolation portion 144 that isolates pixels is provided so as to penetrate the readout circuit substrate 100, the n-type InP layer 226, and the undoped InGaAs layer 224 and reach the p-type InP layer 222. In other words, the n-type InP layer 226 and the undoped InGaAs layer 224 forming the photodiode PD are surrounded by the element isolation portions 144 for each pixel P. Therefore, a large part of the light which is not absorbed in the photodiode PD and transmitted through the sensor substrate 200 is emitted outside the element without being reflected within the pixel P.

In particular, in the imaging device according to the present embodiment, the element isolation portion 144 is defined by the through groove formed from the readout circuit substrate 100 side, and the wall face of the element isolation portion 144 forms a continuous plane extending from the readout circuit substrate 100 to the sensor substrate 200. That is, since there is no step or displacement on the sidewall of the element isolation portion 144 between the readout circuit substrate 100 and the sensor substrate 200, it is possible to minimize the ratio at which the light transmitted through the sensor substrate 200 is reflected by the element isolation portion 144.

Therefore, according to the imaging device of the present embodiment, it is possible to suppress crosstalk due to a reflected light to adjacent pixels or the like. Further, inflow of the photocurrent over a plurality of photodiodes PD that may cause a blur is prevented, and the blur is prevented. As a result, it is possible to obtain an image with high resolution. While the pixel P also includes the through electrode 158 having a possibility of reflecting an incident light, since it is easy to reduce the diameter of the contact hole used for forming the through electrode 158, crosstalk due to the reflected light caused by the through electrode 158 can be sufficiently reduced.

Further, since the element isolation portion 144, the common electrode 150, the through electrode 158, and the contact plug 160 are formed after joining the readout circuit substrate 100 and the sensor substrate 200 to each other, the positional relationships thereof are not affected by the stacking alignment accuracy between wafers. That is, high stacking alignment accuracy is not necessary when joining the readout circuit substrate 100 and the sensor substrate 200 to each other. Further, by thinning the readout circuit substrate 100 after joining the readout circuit substrate 100 and the sensor substrate 200 to each other, it is possible to reduce occurrence of distortion due to the difference in linear expansion coefficients between the readout circuit substrate 100 and the sensor substrate 200.

As described above, according to the present embodiment, it is possible to acquire a high-definition image with high resolution and to suppress occurrence of a contact failure in an electrical connection portion between wafers.

Second Embodiment

Figure 8:
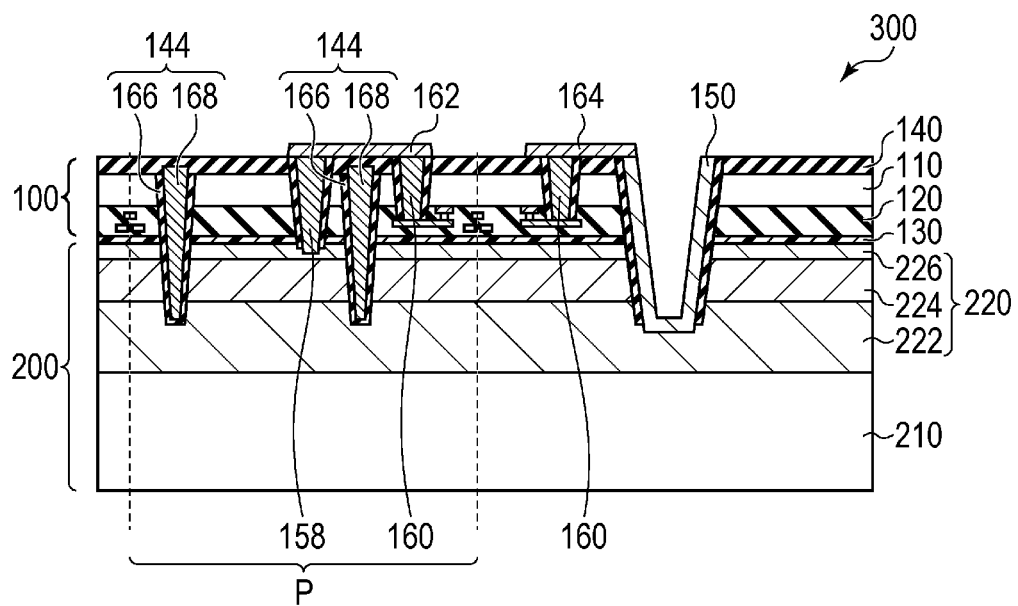
FIG. 8 is a schematic cross-sectional view illustrating the structure of an imaging device according to a second embodiment of the present invention.

An imaging device and a method of manufacturing the same according to a second embodiment of the present invention will be described with reference to FIG. 8. Components similar to those of the imaging device according to the first embodiment are labeled with the same reference, and the description thereof will be omitted or simplified. FIG. 8 is a schematic cross-sectional view illustrating the structure of the imaging device according to the present embodiment.

The imaging device 300 according to the present embodiment is the same as the imaging device according to the first embodiment except that the element isolation portion 144 also has a function as a light shield wall. That is, the element isolation portion 144 of the imaging device 300 according to the present embodiment includes an insulating portion 166 formed of an insulating material and a light shield wall 168 formed of a light shield member embedded inside the insulating portion 166 as illustrated in FIG. 8. Since the element isolation portion 144 includes the light shield wall 168, the leakage of the transmitted light to the adjacent pixels P can be further reduced, and the crosstalk can be suppressed. Further, by providing the element isolation portion 144 including the light shield wall 168, an incident light on the MOS transistor formed on the silicon substrate 110 in the region other than the pixel region can be reduced, and malfunction of the MOS transistor can be suppressed. This can improve flexibility of layout design.

The element isolation portion 144 including the light shield wall 168 is formed by forming the element isolation groove 142 in the process illustrated in FIG. 4D, then depositing an insulating film such as silicon oxide, silicon nitride, or the like and a metal film such as titanium, copper, tungsten, or the like, and removing the metal film on the surface by a CMP method.

As described above, according to the present embodiment, it is possible to effectively suppress crosstalk between adjacent pixels and acquire a high-definition image with higher resolution.

Third Embodiment

Figure 9:
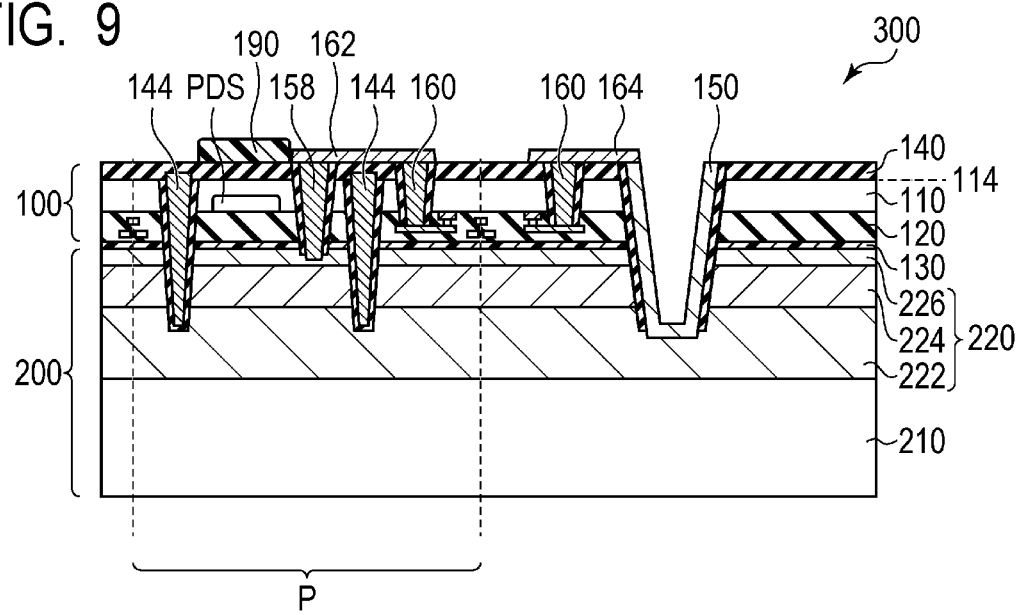
FIG. 9 is a schematic cross-sectional view illustrating the structure of an imaging device according to a third embodiment of the present invention.
Figure 10:
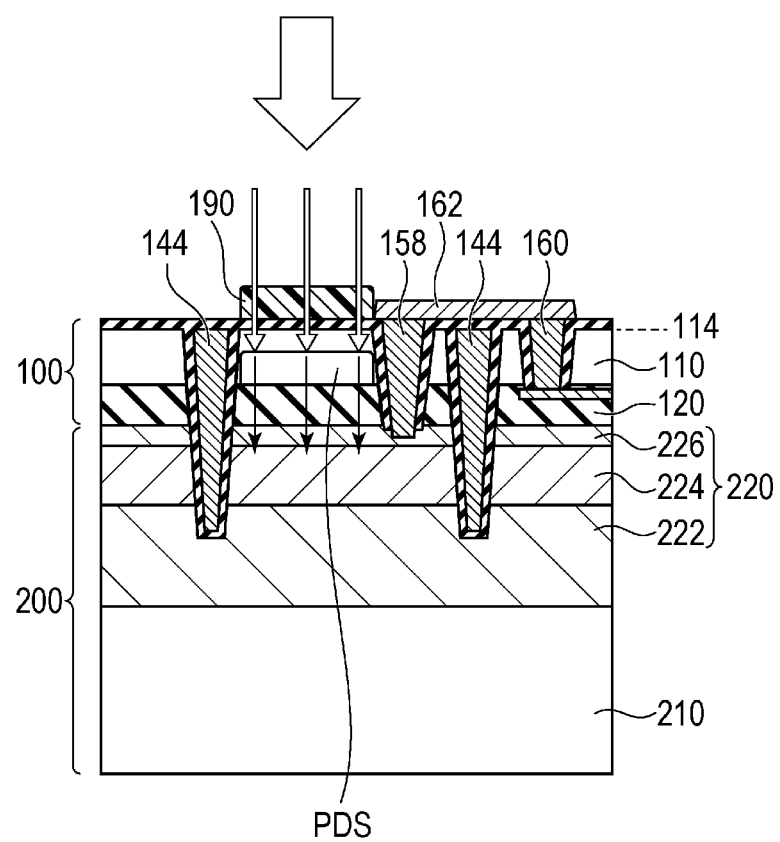
FIG. 10 is a diagram illustrating the effect and advantage of the imaging device according to the third embodiment of the present invention.

An imaging device and a method of manufacturing the same according to a third embodiment of the present invention will be described with reference to FIG. 9 and FIG. 10. Components similar to those of the imaging device according to the first and the second embodiments are labeled with the same reference, and the description thereof will be omitted or simplified. FIG. 9 is a schematic cross-sectional view illustrating the structure of the imaging device according to the present embodiment. FIG. 10 is a diagram illustrating the effect and advantage of the imaging device according to the present embodiment.

The imaging device 300 according to the present embodiment is the same as the imaging device according to the second embodiment except that a photodiode PDS having sensitivity to the visible light region and a color filter layer 190 are provided as illustrated in FIG. 9. The photodiode PDS is arranged within the silicon substrate 110 in a region that overlaps the region where the photodiode PD is provided in a plan view. Further, the color filter layer 190 is arranged over the second face 114 side of the silicon substrate 110 in a region that overlaps the region where the photodiode PD is provided in a plan view.

In the imaging device according to the present embodiment, an incident light to the imaging device 300 is irradiated from the second face 114 side of the silicon substrate 110 as illustrated in FIG. 10. The light incident from the second face 114 side of the silicon substrate 110 is absorbed by the photodiode PDS provided over the silicon substrate 110, and a photocurrent is generated. While silicon has a high optical absorption coefficient in the visible light region, since the light absorption coefficient in the infrared region is small, most infrared rays transmit the silicon substrate 110 and enter the sensor substrate 200. The light entering the sensor substrate 200 is absorbed by the photodiode PD, and a photocurrent is generated. By arranging the color filter layer 190 on the second face 144 side of the silicon substrate 110, it is possible to acquire an electric signal to be a color image.

The imaging device according to the present embodiment includes the photodiode PDS having sensitivity to the visible light region in addition to the photodiode PD having sensitivity to the infrared region. Therefore, according to the imaging device of the present embodiment, it is possible to acquire information from the visible light region to the infrared region at the same time. Further, since the imaging device has the structure in which the photodiode PD and the photodiode PDS are stacked, it is possible to contribute to reduction in size and increase the number of pixels of the imaging device. Further, by appropriately adjusting the thickness of the silicon substrate 110 to cut a light in the visible light region, it is also possible to realize a state in which only the light in the infrared region enters the sensor substrate 200.

The photodiode PDS is a photodiode formed of a p-n junction of the p-type silicon and the n-type silicon and can be formed by adding an impurity from the first face 112 side of the silicon substrate 110 by an ion implantation method or the like.

Note that, while a configuration in which the photodiode PDS and the color filter layer 190 are added to the imaging device of the second embodiment is illustrated in FIG. 9 and FIG. 10, the photodiode PDS and the color filter layer 190 may also be added to the imaging device of the first embodiment.

As described above, according to the present embodiment, it is possible to effectively suppress crosstalk between adjacent pixels and acquire a high-definition image with a higher resolution. Further, an image including information on a wider wavelength range can be acquired compared to the case of the first and second embodiments.

Fourth Embodiment

An imaging system according to a fourth embodiment of the present invention will be described by using FIG. 12. FIG. 12 is a block diagram illustrating a general configuration of the imaging system according to the present embodiment.

The imaging device 300 described in the first to third embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 12 illustrates a block diagram of a digital still camera as an example out of these examples.

The imaging system 400 illustrated as an example in FIG. 12 includes an imaging device 401, a lens 402 that captures an optical image of a subject onto the imaging device 401, an aperture 404 for changing a light amount passing through the lens 402, and a barrier 406 for protecting the lens 402. The lens 402 and the aperture 404 form an optical system that converges a light onto the imaging device 401. The imaging device 410 is the imaging device 300 described in any of the first to third embodiments and converts an optical image captured by the lens 402 into image data.

The imaging system 400 further includes a signal processing unit 408 that processes an output signal output from the imaging device 401. The signal processing unit 408 preforms an AD-conversion that converts an analog signal output by the imaging device 401 into a digital signal. In addition, the signal processing unit 408 performs various correction and compression other than above, if necessary, and outputting image data. An AD-conversion unit, which is a part of the signal processing unit 408, may be formed on a semiconductor substrate on which the imaging device 401 is provided or a semiconductor substrate on which the imaging device 401 is not provided. Further, the imaging device 401 and the signal processing unit 408 may be formed on the same semiconductor substrate.

The imaging system 400 further includes a memory unit 410 for temporarily storing image data therein and an external interface unit (external I/F unit) 412 for communicating with an external computer or the like. The imaging system 400 further includes a storage medium 414 such as a semiconductor memory for performing storage or readout of imaging data and a storage medium control interface unit (storage medium control I/F unit) 416 for performing storage or readout on the storage medium 414. Note that the storage medium 414 may be embedded in the imaging system 400 or may be removable.

The imaging system 400 further includes a general control/operation unit 418 that controls various operations and the entire digital still camera and a timing generation unit 420 that outputs various timing signals to the imaging device 401 and the signal processing unit 408. Here, the timing signal or the like may be input from the outside, and the imaging system 400 may include at least the imaging device 401 and the signal processing unit 408 that processes an output signal output from the imaging device 401.

The imaging device 401 outputs an imaging signal to the signal processing unit 408. The signal processing unit 408 performs predetermined signal processing on an imaging signal output from the imaging device 401 and outputs image data. The signal processing unit 408 uses an imaging signal to generate an image.

As discussed above, according to the present embodiment, the imaging system to which the imaging device 300 according to the first to third embodiments is applied can be realized.

Fifth Embodiment

Figure 13A:
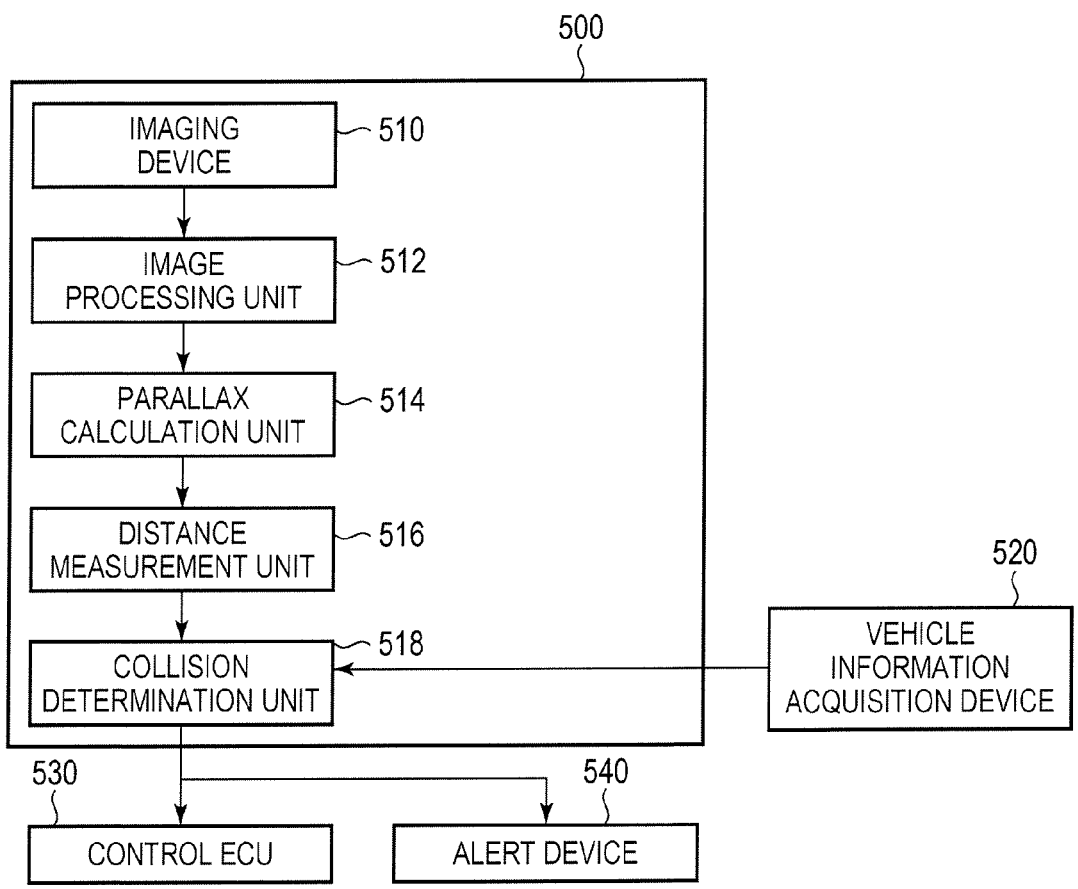
FIG. 13A is a diagram illustrating a configuration example of an imaging system according to a fifth embodiment of the present invention.
Figure 13B:
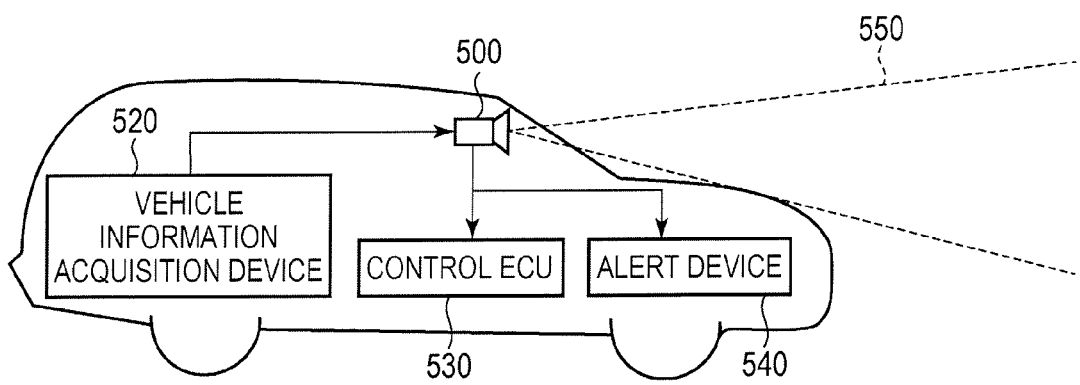
FIG. 13B is a diagram illustrating a configuration example of a movable object according to the fifth embodiment of the present invention.

An imaging system and a movable object according to a fourth embodiment of the present invention will be described by using FIG. 13A and FIG. 13B. FIG. 13A is a diagram illustrating a configuration of an imaging system according to the present embodiment. FIG. 13B is a diagram illustrating a configuration of a movable object according to the present embodiment.

FIG. 13A illustrates an example of an imaging system related to an on-vehicle camera. The imaging system 500 includes an imaging device 510. The imaging device 510 is the imaging device 300 described in any of the first to third embodiments described above. The imaging system 500 includes an image processing unit 512 that performs image processing on a plurality of image data acquired by the imaging device 510 and a parallax acquisition unit 514 that calculates a parallax (a phase difference of parallax images) from the plurality of image data acquired by the imaging system 500. Further, the imaging system 500 includes a distance acquisition unit 516 that calculates a distance to the object based on the calculated parallax and a collision determination unit 518 that determines whether or not there is a collision possibility based on the calculated distance. Here, the parallax acquisition unit 514 and the distance acquisition unit 516 are an example of a distance information acquisition unit that acquires distance information on the distance to the object. That is, the distance information is information on a parallax, a defocus amount, a distance to an object, or the like. The collision determination unit 518 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 500 is connected to the vehicle information acquisition device 520 and can acquire vehicle information such as a vehicle speed, a yaw rate, a steering angle, or the like. Further, the imaging system 500 is connected to a control ECU 530, which is a control device that outputs a control signal for causing a vehicle to generate braking force based on a determination result by the collision determination unit 518. Further, the imaging system 500 is also connected to an alert device 540 that issues an alert to the driver based on a determination result by the collision determination unit 518. For example, when the collision probability is high as the determination result of the collision determination unit 518, the control ECU 530 performs vehicle control to avoid a collision or reduce damage by applying a brake, pushing back an accelerator, suppressing engine power, or the like. The alert device 540 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 500. FIG. 13B illustrates the imaging system when a front area of a vehicle (a capturing area 550) is captured. The vehicle information acquisition device 520 transmits an instruction to the imaging system 500 or the imaging device 510. Such a configuration can further improve the ranging accuracy.

Although the example of control for avoiding a collision to another vehicle includes been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

While the sensor substrate 200 is joined on the first face 112 side of the silicon substrate 110 in the first to third embodiments described above, for example, the sensor substrate 200 may be joined on the second face 114 side of the silicon substrate 110. Also in this case, by providing the element isolation portion 144 that penetrates the readout circuit substrate 100 and separates a plurality of photoelectric conversion units from each other, it is possible to obtain the same advantage as those in the embodiments described above.

Further, while the electrode (common electrode 150) connected to the p-type InP layer 222 is shared by a plurality of pixels in the first to third embodiments described above, an electrode connected to the p-type InP layer 222 may be provided in each pixel.

Further, while an intra-pixel readout circuit is arranged outside the element isolation portion 144 in the first to third embodiments described above as illustrated in FIG. 2, for example, the intra-pixel readout circuit may be arranged inside the element isolation portion 144.

Figure 11:
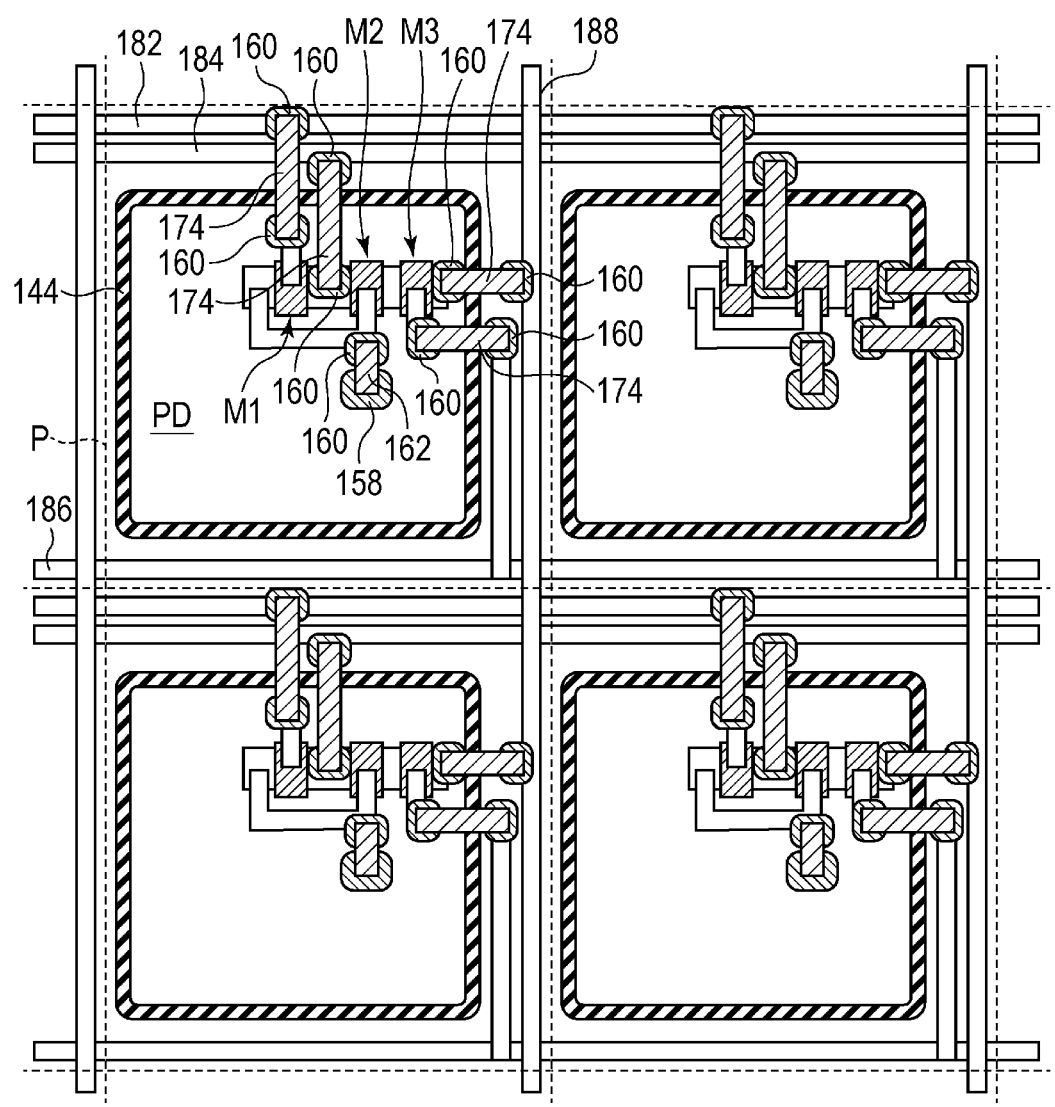
FIG. 11 is a plan view illustrating the structure of an imaging device according to a modified example of the embodiment of the present invention.

FIG. 11 is a configuration example in the case where an intra-pixel readout circuit is arranged inside the element isolation portion 144. When the intra-pixel readout circuit is arranged inside the element isolation portion 144, an interconnection that connects the intra-pixel readout circuit to the reset line 182, the power supply line 184, the select line 186, and the output line 188 cannot be formed of the interconnection layer 124 or the like arranged in the CMOS circuit portion 120. In such a case, interconnections that connect the intra-pixel readout circuit to the reset line 182, the power supply line 184, the select line 186, and the output line 188 can be provided via the contact plug 160 and an interconnection 174 in the same manner as the connection between the intra-pixel readout circuit and the photodiode PD. The interconnection 174 is an interconnection provided on the second face 114 side of the silicon substrate 110 in the same manner as the interconnection 162 and the interconnection 164. Note that, while the contact plug 160 and the interconnection 174 are illustrated as the uppermost layer in terms of clarification of the connection relationship in FIG. 11, the contact plug 160 and the interconnection 174 are arranged in the lowermost layer in the actual positional relationship when viewed from the second face 214 side of the InP substrate 210, which is the light incident surface.

Further, the imaging systems illustrated in the fourth and fifth embodiments described above are examples of an imaging system to which the photoelectric conversion device of the present invention may be applied, and an imaging system to which the photoelectric conversion device of the present invention can be applied is not limited to the configuration illustrated in FIG. 12 and FIG. 13B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-096197, filed May 18, 2018 which is hereby incorporated by reference herein in its entirety.

What is claimed is:

1. An imaging device comprising:
a first substrate including a photoelectric conversion layer which includes a first semiconductor layer of a first conductivity type and a second semiconductor layer of a second conductivity type and in which a plurality of photoelectric conversion units are provided;
a second substrate which is joined to the first substrate and in which a readout circuit that outputs a signal based on information detected by the plurality of photoelectric conversion units is provided; and
an element isolation portion defined by a first opening provided so as to penetrate the second substrate and at least one of the first semiconductor layer and the second semiconductor layer,
wherein each of the plurality of photoelectric conversion units is separated from each other by the element isolation portion.

2. The imaging device according to claim 1, wherein the first opening forms a continuous plane between the first substrate and the second substrate.

3. The imaging device according to claim 1, wherein the element isolation portion includes an insulating member provided in the first opening.

4. The imaging device according to claim 3, wherein the element isolation portion further includes a light shield member provided in the first opening.

5. The imaging device according to claim 1 further comprising:
a first through electrode that is provided in a second opening penetrating the second substrate and reaching the first semiconductor layer and is electrically connected to the first semiconductor layer; and
a second through electrode that is provided in a third opening penetrating the second substrate and reaching the second semiconductor layer and is electrically connected to the second semiconductor layer.

6. The imaging device according to claim 5,
wherein the first through electrode is provided in connection to the first semiconductor layer of each of the plurality of photoelectric conversion units, and
wherein the second through electrode is connected to the second semiconductor layer that is common to the plurality of photoelectric conversion units.

7. The imaging device according to claim 6, wherein the first semiconductor layer is provided closer to the second substrate side than the second semiconductor later.

8. The imaging device according to claim 5,
wherein the second substrate has a first face facing the first substrate and a second face opposite to the first face, and
wherein each of the first through electrode and the second through electrode is electrically connected to the readout circuit via an interconnection arranged over the second face side of the second substrate.

9. The imaging device according to claim 1, wherein the second substrate further includes a plurality of second photoelectric conversion units arranged over corresponding regions in which the plurality of photoelectric conversion units overlap, respectively, in a plan view.

10. The imaging device according to claim 9, wherein an absorption wavelength band of a semiconductor material forming the plurality of photoelectric conversion units is on a longer wavelength side of an absorption wavelength band of a semiconductor material forming the plurality of second photoelectric conversion units.

11. The imaging device according to claim 1, wherein the photoelectric conversion layer is provided between the first semiconductor layer and the second semiconductor layer and further includes a third semiconductor layer formed of an undoped semiconductor material.

12. The imaging device according to claim 1, wherein the photoelectric conversion layer includes a semiconductor material having an absorption wavelength band in an infrared wavelength band.

13. The imaging device according to claim 1, wherein the photoelectric conversion layer is formed of a semiconductor material having a carrier mobility that is not less than a carrier mobility of silicon.

14. The imaging device according to claim 1, wherein the photoelectric conversion layer is formed of a compound semiconductor material including In, Ga, and As.

15. A method of manufacturing an imaging device comprising:
forming a first semiconductor layer of a first conductivity type and a second semiconductor layer of a second conductivity type over a first substrate to form a photoelectric conversion layer including the first semiconductor layer and the second semiconductor layer;
joining a second substrate to the first substrate on which the photoelectric conversion layer is provided; and
forming a first opening from the second substrate side so as to penetrate at least the second substrate and the second semiconductor layer to separate the photoelectric conversion layer into a plurality of photoelectric conversion units.

16. The method of manufacturing an imaging device according to claim 15 further comprising:
forming a second opening penetrating the second substrate and the second semiconductor layer and reaching the first semiconductor layer;
forming a first through electrode electrically connected to the first semiconductor layer in the second opening;
forming a third opening penetrating the second substrate and reaching the second semiconductor layer; and
forming a second through electrode electrically connected to the second semiconductor layer in the third opening.

17. The method of manufacturing an imaging device according to claim 16, wherein the second substrate includes a readout circuit that outputs a signal based on information detected by the plurality of photoelectric conversion units, and the method further comprising:
forming a fourth opening reaching a first interconnection connected to the readout circuit on the second substrate;
forming an electrode connected to the first interconnection in the fourth opening; and
forming a second interconnection connecting the electrode to the first through electrode or the second through electrode on the second substrate.

18. An imaging system comprising:
   the imaging device according to claim 1; and
   a signal processing unit that processes a signal output from the imaging device.
19. A movable object comprising:
   the imaging device according to claim 1;
   a distance information acquisition unit that acquires distance information on a distance to an object, from a parallax image based on signals from the imaging device; and
   a control unit that controls the movable object based on the distance information.

\* \* \* \* \*